US010403279B2

(12) United States Patent
Zhao et al.

(10) Patent No.: US 10,403,279 B2
(45) Date of Patent: Sep. 3, 2019

(54) LOW-POWER, ALWAYS-LISTENING, VOICE COMMAND DETECTION AND CAPTURE

(71) Applicant: Avnera Corporation, Beaverton, OR (US)

(72) Inventors: Xudong Zhao, Portland, OR (US); Alexander C. Stange, Portland, OR (US); Shawn O'Connor, Portland, OR (US); Ali Hadiashar, Portland, OR (US)

(73) Assignee: Avnera Corporation, Beaverton, OR (US)

( * ) Notice: Subject to any disclaimer, the term of this patent is extended or adjusted under 35 U.S.C. 154(b) by 36 days.

(21) Appl. No.: 15/706,178

(22) Filed: Sep. 15, 2017

(65) Prior Publication Data
US 2018/0174583 A1 Jun. 21, 2018

Related U.S. Application Data

(60) Provisional application No. 62/437,598, filed on Dec. 21, 2016.

(51) Int. Cl.
*G10L 15/00* (2013.01)
*G10L 15/22* (2006.01)
(Continued)

(52) U.S. Cl.
CPC ............. *G10L 15/22* (2013.01); *G10L 25/78* (2013.01); *G10L 25/84* (2013.01);
(Continued)

(58) Field of Classification Search
CPC ................................ G10L 15/20; G10L 17/14
(Continued)

(56) References Cited

U.S. PATENT DOCUMENTS 5,983,186 A * 11/1999 Miyazawa .............. G10L 15/26
704/233
2002/0188445 A1 12/2002 Li
(Continued)

FOREIGN PATENT DOCUMENTS

CN 100548060 C 10/2009
TW 201638932 A 11/2016

OTHER PUBLICATIONS

International Search Report and Written opinion for PCT/US2017/067712, dated Apr. 6, 2018, 14 pages, European Patent Office, Rijswijk, Netherlands.
(Continued)

*Primary Examiner* — Daniel Abebe
(74) *Attorney, Agent, or Firm* — Miller Nash Graham & Dunn LLP

(57) ABSTRACT

A system for detecting and capturing voice commands, the system comprising a voice-activity detector (VAD) configured to receive a VAD-received digital-audio signal; determine the amplitude of the VAD-received digital-audio signal; compare the amplitude of the VAD-received digital-audio signal to a first threshold and to a second threshold; withhold a VAD interrupt signal when the amplitude of the VAD-received digital-audio signal does not exceed the first threshold or the second threshold; generate the VAD interrupt signal when the amplitude of the VAD-received digital-audio signal exceeds the first threshold and the second threshold; and perform spectral analysis of the VAD-received digital-audio signal when the amplitude of the VAD-received digital-audio signal is between the first threshold and the second threshold.

20 Claims, 5 Drawing Sheets

(51) Int. Cl.
- *G10L 25/84* (2013.01)
- *G10L 25/78* (2013.01)
- *H03M 3/00* (2006.01)
- *G10L 15/08* (2006.01)

(52) U.S. Cl.
CPC .. *G10L 2015/088* (2013.01); *G10L 2025/783* (2013.01); *H03M 3/458* (2013.01)

(58) Field of Classification Search
USPC .......................................................... 704/275
See application file for complete search history.

(56) References Cited

U.S. PATENT DOCUMENTS

| | | | |
|---|---|---|---|
| 2010/0104049 A1* | 4/2010 | LeBlanc | H04Q 1/457 375/340 |
| 2012/0010890 A1* | 1/2012 | Koverzin | H04W 52/0254 704/275 |
| 2015/0039303 A1 | 2/2015 | Lesso et al. | |
| 2015/0356982 A1* | 12/2015 | Chesney | G10L 25/84 704/275 |
| 2017/0116992 A1* | 4/2017 | Liu | G10L 15/26 |
| 2017/0270920 A1* | 9/2017 | Lesso | G10L 15/28 |

OTHER PUBLICATIONS

Taiwan Intellectual Property Office, First Office Action in Primary Examination, dated Jan. 9, 2019, 6 pages, Title: Low-power, always-listening, voice-command detection and capture, Applicant:Applicant: Avnera Corporation, Taiwan Patent Application No. 106144833.

* cited by examiner

LOW-POWER, ALWAYS-LISTENING, VOICE COMMAND DETECTION AND CAPTURE

FIELD OF THE INVENTION

This disclosure is directed to a system and methods for voice detection and capture of voice commands.

BACKGROUND

Many consumer electronic devices have functions that are controlled in whole or in part by voice commands issued by a human voice. This voice control allows users to operate the devices without the use of the user's hands and with fewer buttons or switches on the device.

Such devices may require an always-listening mode so that the device may "hear" and capture the voice commands. Thus, in the always listening mode, the device is on and waits for a voice command. The quality of an always-listening function is generally measured by two metrics: the overall average current consumption and the voice-command misdetection rate.

Embodiments of the invention address shortcomings in existing devices.

SUMMARY OF THE DISCLOSURE

Embodiments of the disclosed subject matter are directed to a low-power, always-listening, voice-command detection and capture system. By utilizing a lower-current operational state, the system can reduce the overall average current consumption of the system. In the lowest-current operational state, the system waits for signs of voice activity. Each ensuing state has a gradually higher confidence of voice command detection, until the highest-current operational state where the voice command is detected, recognized, and processed.

Accordingly, at least some embodiments of a system for detecting and capturing voice commands may include a voice-activity detector (VAD) configured to receive a VAD-received digital-audio signal; determine the amplitude of the VAD-received digital-audio signal; compare the amplitude of the VAD-received digital-audio signal to a first threshold and to a second threshold; withhold a VAD interrupt signal when the amplitude of the VAD-received digital-audio signal does not exceed the first threshold or the second threshold; generate the VAD interrupt signal when the amplitude of the VAD-received digital-audio signal exceeds the first threshold and the second threshold; and perform spectral analysis of the VAD-received digital-audio signal when the amplitude of the VAD-received digital-audio signal is between the first threshold and the second threshold.

In another aspect, at least some embodiments of a method of detecting and capturing voice commands may include receiving, by a voice-activity detector (VAD), a VAD-received digital-audio signal; determining, by the VAD, the amplitude of the VAD-received digital-audio signal; comparing, by the VAD, the amplitude of the VAD-received digital-audio signal to a first threshold and to a second threshold; withholding, by the VAD, a VAD interrupt signal when the amplitude of the VAD-received digital-audio signal does not exceed the first threshold or the second threshold; generating, by the VAD, the VAD interrupt signal when the amplitude of the VAD-received digital-audio signal exceeds the first threshold and the second threshold; and performing, by the VAD, spectral analysis of the VAD-received digital-audio signal when the amplitude of the VAD-received digital-audio signal is between the first threshold and the second threshold.

Accordingly, when compared to existing devices, the described systems and methods may provide a lower voice-command misdetection rate at a lower average current consumption.

Figure 1:
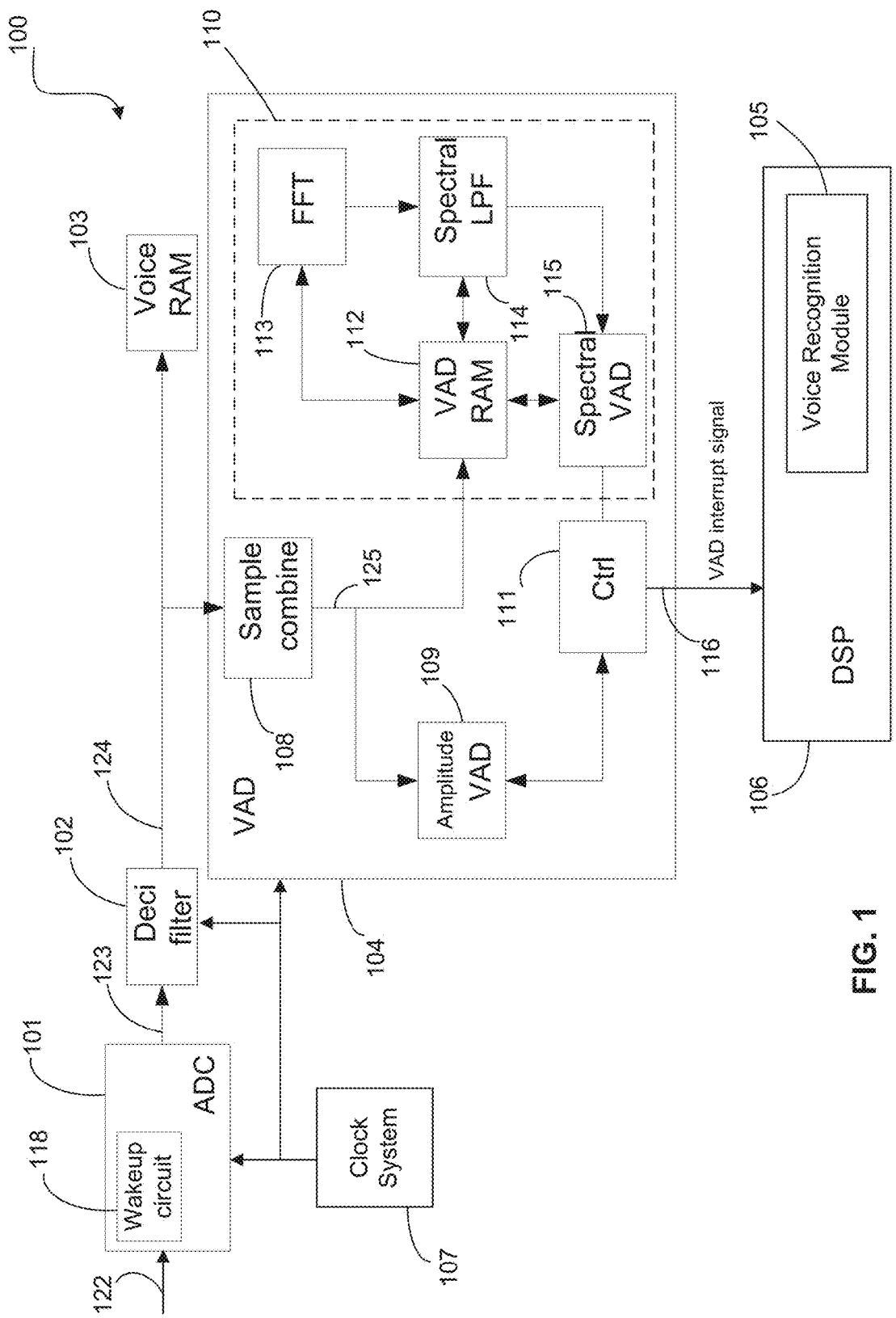
FIG. 1 is a functional block diagram of a voice-command detection and capture system, according to embodiments of the invention.
Figure 2:
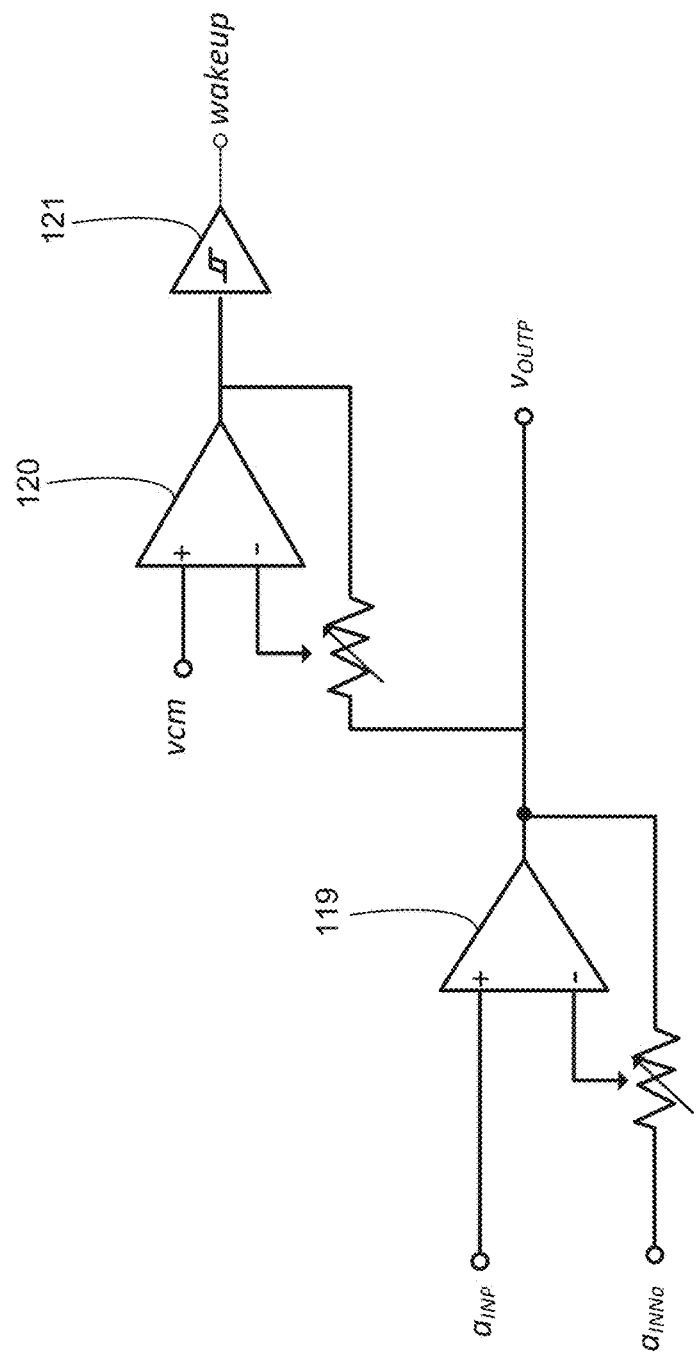
FIG. 2 is a circuit diagram of a wakeup circuit that may be included in the voice-recognition module shown in FIG. 1.
Figure 3:
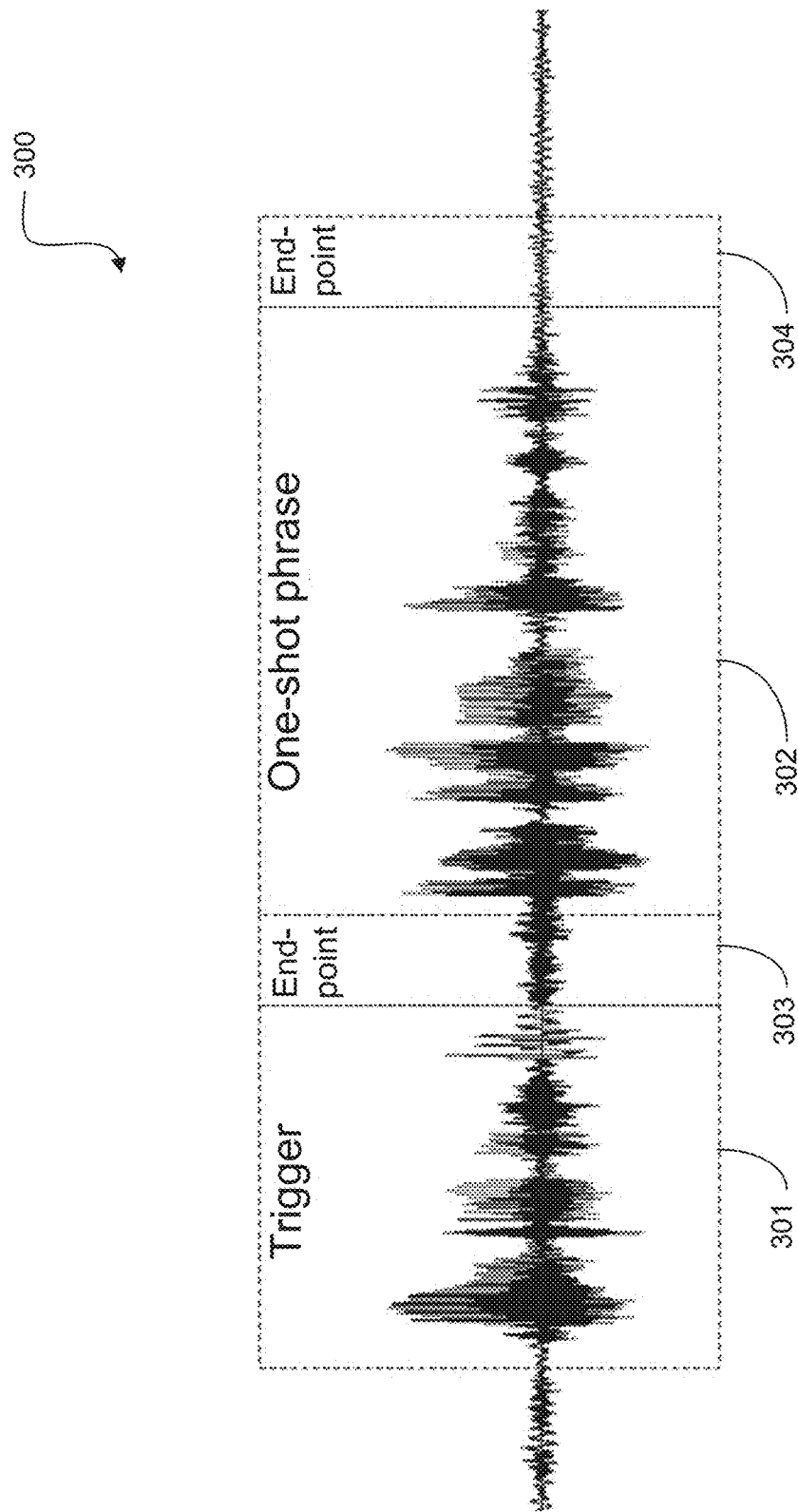
FIG. 3 shows an example graph of audio signals from human speech, where the vertical axis represents signal amplitude and the horizontal axis represents time.
Figure 4:
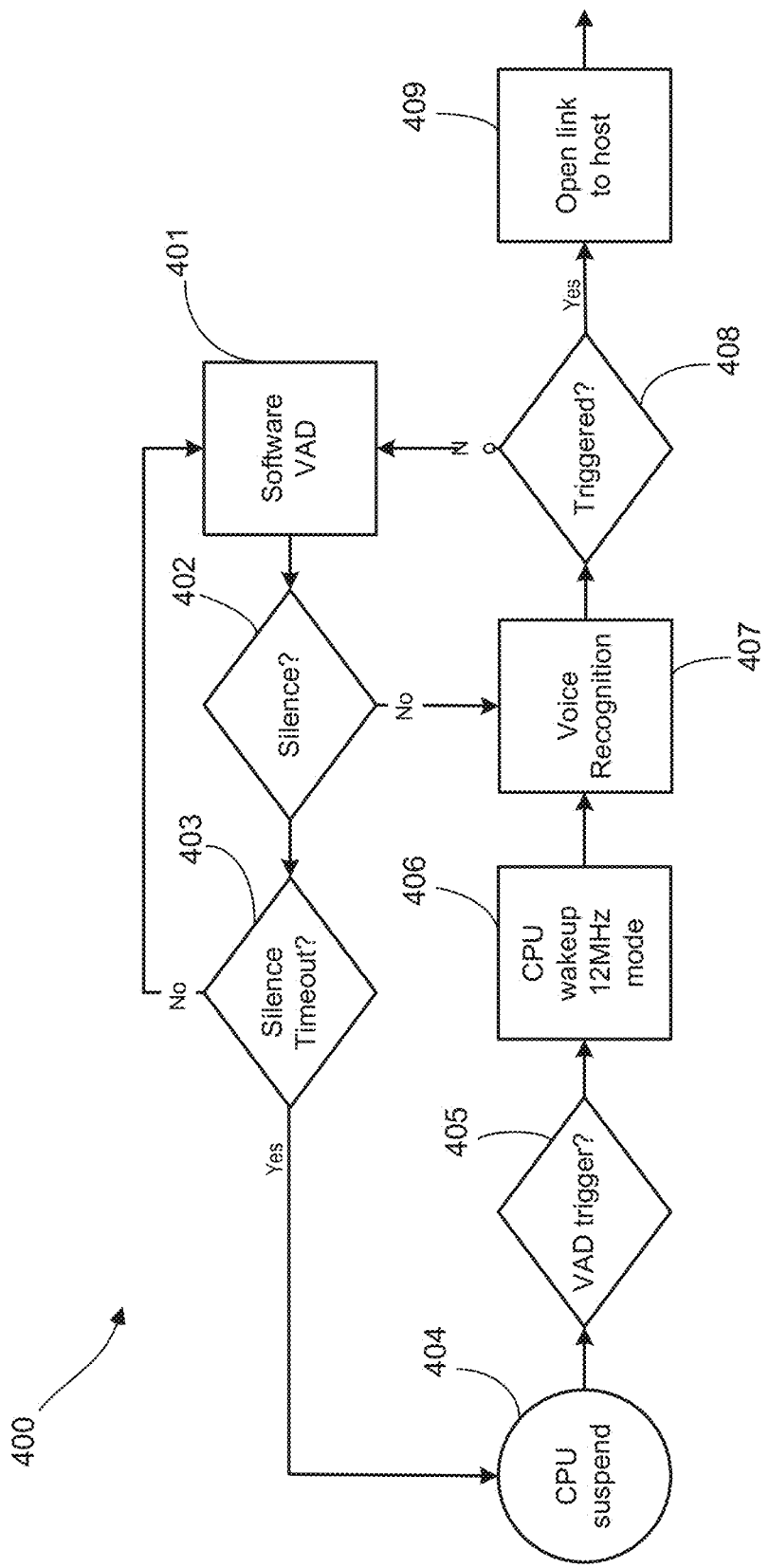
FIG. 4 is a flowchart showing an example process of the voice-recognition module shown in FIG. 1.
Figure 5:
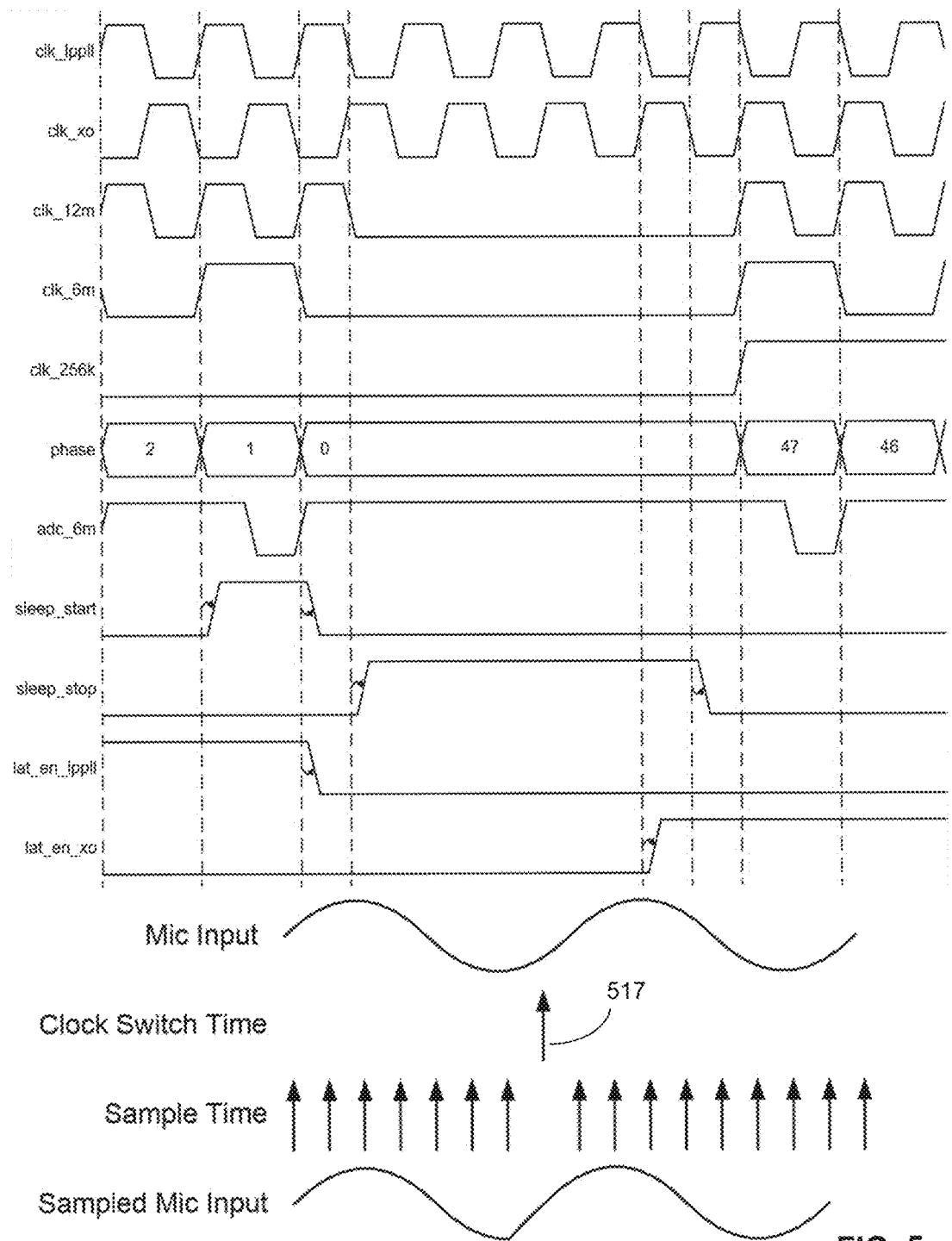
FIG. 5 shows an example of a clock switching event according to a feature of a voice-command detection and capture system.

In the Detailed Description that follows, reference numbers of the pattern 1xx are generally shown in FIGS. 1 and 2, while 3xx reference numbers are generally shown in FIG. 3. Likewise, 4xx reference numbers are generally shown in FIG. 4, and 5xx reference numbers are generally shown in FIG. 5.

DETAILED DESCRIPTION

As described in this application, embodiments of the invention are directed to a low-power, always-listening, voice-command detection and capture system. The disclosed technology includes a number of discrete operational states, utilizing different amounts of current. The operational states are characterized by the collective states of the individual subsystems. In the lowest-current operational state, the system waits for signs of voice activity. Each ensuing state has a gradually higher confidence of voice command detection, until the highest-current operational state where the voice command is detected, recognized, and processed.

By utilizing a lower-current operational state, the system can reduce the overall average current consumption of the system. Moreover, by selectively using all or just some of the available operational states, the system may reduce the voice-command misdetection rate. For example, the system may avoid sleeping to capture, rather than truncate, the beginning of a phrase. Accordingly, when compared to existing devices, the described system may provide a lower voice-command misdetection rate at a lower average current consumption.

Hence, the disclosed technology may be useful in any voice-activated and controlled system, including, for example, wired and wireless headphones, wearable products, speaker bars, game controllers, and mobile devices such as phones and tablets. These voice-activated and controlled systems might include an intelligent personal assistant or another software agent.

FIG. 1 is a functional block diagram showing portions of a low-power, always-listening, voice-command detection and capture system according to embodiments of the invention. As illustrated in FIG. 1, a voice-command detection and capture system 100 may include an analog-to-digital converter (ADC) 101, a decimation filter 102, voice RAM (random access memory) 103, and a voice-activity detector (VAD) block 104 that outputs to a voice-recognition module 105 of a digital signal processor (DSP) 106. The decimation filter 102 and the voice RAM 103 may each be part of, or closely coupled to, the DSP 106. The ADC 101, the decimation filter 102, the voice RAM 103, the VAD block 104, and the DSP 106 are each controlled by a clock system 107 that includes a plurality of clock generating mechanisms and which is discussed more thoroughly below.

The VAD block 104 may include a sample combine block 108, an amplitude VAD block 109, a spectral analysis block 110, and a control block 111. The spectral analysis block 110 may include VAD RAM 112, a fast Fourier transform (FFT) block 113, a spectral low-pass filter (LPF) 114, and a spectral VAD block 115. Features of the VAD block 104 may be implemented through programmable parameters. Because the VAD block 104 is preferably implemented in hardware, it is referred to here as the hardware VAD. Even so, in embodiments the VAD block 104 may be implemented in software or firmware.

The ADC 101 may be a stereophonic ADC generating a digital-audio signal 123 at, for example, 2 Msps (megasamples per second) from an analog audio input, which might include a voice signal. The ADC 101 may use, for example, pulse-density modulation (PDM), pulse-code modulation (PCM), or other techniques to produce the digital-audio signal 123 from an analog audio input 122.

The ADC 101 may include a wakeup circuit 118 to detect audio activity and to provide an activation functionality for the remainder of the ADC 101 and, therefore, also the VAD block 104. Accordingly, the wakeup circuit 118 may compare the analog audio input 122 to a threshold to determine whether there is an onset level of audio activity. When the analog audio input 122 is below the onset level of audio activity, the remainder of the ADC 101 is not active. But, when the analog audio input 122 is above the onset level of audio activity, the remainder of the ADC 101 is active. This threshold is sometimes referred to here as the wakeup-onset threshold.

Thus, the ADC 101 may have two modes. In one mode, the ADC 101 compares levels using the wakeup circuit 118 but does not generate digital samples. Hence, the converter portion of the ADC 101 may be powered down completely in this level-comparison mode, or sleep mode, thereby providing a low-power state for the ADC 101. Preferably, in the sleep mode the wakeup circuit 118 is in a low-power mode, meaning that the wakeup circuit 118 is consuming, per channel, less than about 15% of the power that is consumed by the wakeup circuit 118 and the ADC 101 when both are active. More preferably, the wakeup circuit 118 consumes, per channel, less than about 12% of the power that is consumed by the wakeup circuit 118 and the ADC 101 when both are active. Even more preferably, the wakeup circuit 118 consumes, per channel, about 8% of the power that is consumed by the wakeup circuit 118 and the ADC 101 when both are active. In the second mode, or active mode, the ADC 101 generates digital signals from the analog audio input 122.

FIG. 2 is a circuit diagram showing portions of a wakeup circuit. As illustrated in FIG. 2, the wakeup circuit 118 may include an audio preamp 119 having an additional gain stage 120 and a comparator stage 121. The comparator stage 121 may be, for example, a Schmitt trigger. Accordingly, the wakeup circuit may take the analog audio input 122, boost the analog audio input 122 with the audio preamp 119 and the additional gain stage 120, and compare the conditioned analog audio input to a voice-level threshold with the comparator stage 121. If the conditioned analog audio input exceeds the voice-level threshold, then the wakeup circuit activates the remainder of the ADC 101 to generate samples. The voice-level threshold may be the wakeup-onset threshold discussed above.

In addition to boosting the signal, the audio preamp 119 and the additional gain stage 120 may condition the analog audio input 122, for example, through common-mode rejection or power-supply rejection, or both. Preferably, the gain of the audio preamp 119 and the gain of the additional gain stage 120 are each programmable. As an illustration, the audio preamp 119 may be programmed or preset to have a gain of, for example, +6 dB, +10 dB, +16 dB, and +26 dB, and the additional gain stage 120 may be programmed or preset to have a gain of, for example, +20 dB. Other values could also be programmed or preset.

Returning to FIG. 1, as understood in the art, a digital signal derived from an analog signal includes a number of samples, where the number of samples depends on the sampling rate of the ADC. The decimation filter 102 reduces the sampling rate of the digital-audio signal 123 to, for example, 16 ksps (kilo-samples per second).

The resulting reduced digital-audio samples 124 are stored in the voice RAM 103 for future voice recognition by the voice-recognition module 105 of the DSP 106. Preferably, the voice RAM 103 is configured as a circular buffer to continuously capture the reduced digital-audio samples 124 in a first-in, first-out (FIFO) format. In configurations where the voice RAM 103 is part of, or is closely coupled to, the DSP 106, the configuration reduces system overhead when the digital signal processor needs to process the voice RAM 103.

Additionally, any number of channels may be captured in the voice RAM 103; hence the captured channels are not limited to the channel or channels routed to the VAD block 104. Multi-channel capture allows the VAD block 104 to interrupt the DSP 106 when it suspects voice is present, and it allows the DSP 106 to post-process multi-channel audio for use in speech recognition elsewhere, such as on an ASIC or a host.

The reduced digital-audio samples 124, sometimes referred to here as the VAD-received digital-audio signal, are combined at the sample combine block 108 into, for example, a monophonic 8 ksps stream. The sample combine block 108 may, for example, choose one channel of the reduced digital-audio signal 124 and take every other sample from the chosen channel. To combine the samples, the sample combine block 108 may instead or also have a beamforming capability with delay elements and linear combination circuitry. Regardless of the method used by the sample combine block 108, the result is a combined digital-audio signal 125 that has a lower sampling rate than the reduced digital-audio samples 124 produced by the decimation filter 102.

The amplitude VAD block 109 determines the amplitude of the combined digital-audio signal 125 by analyzing the result from the sample combine block 108.

The control block 111 decides if the spectral analysis block 110 is triggered, if a VAD interrupt signal 116 is sent to the voice-recognition module 105 of the DSP 106 to start voice recognition, or neither. That is, the control block 111 decides whether it has enough information to determine whether to raise a VAD interrupt signal 116 based on the output of the amplitude VAD block 109. If it does not have enough information, the control block 111 triggers the spectral analysis block 110 to provide additional information. For example, the control block 111 may include a low-pass filter of signal amplitude and two comparators. A first of the two comparators may have a relatively low threshold, as compared to a second of the two comparators, which has a relatively high threshold. If the signal amplitude determined by the amplitude VAD block 109 exceeds the lower threshold but not the higher threshold, the control block 111 decides that the spectral analysis block 110 is to be activated. If the signal amplitude exceeds the higher threshold, the control block 111 may decide to generate a VAD interrupt signal 116 regardless of the spectral VAD decision from the spectral analysis block 110. Alternatively, if the signal amplitude exceeds the higher threshold, the control block 111 may decide to generate a VAD interrupt signal 116 and to not activate the spectral analysis block 110. If, however, the signal amplitude determined by the amplitude VAD block 109 does not exceed the lower threshold, the control block 111 decides that a VAD interrupt signal 116 will not be generated and does not activate the spectral analysis block 110.

For example, when the analog audio input 122 to the ADC 101 has a sufficiently low volume, its signal amplitude (determined by the amplitude VAD block 109 from the combined digital-audio signal 125) will not exceed the lower threshold of the control block 111. Accordingly, the control block 111 will neither trigger the spectral analysis block 110 nor generate a VAD interrupt signal 116. If, however, the analog audio input 122 is sufficiently loud, its signal amplitude, determined from the combined digital-audio signal 125, will exceed the higher threshold of the control block 111. Accordingly, the control block 111 will generate a VAD interrupt signal 116 to signal the voice-recognition module 105 of the DSP 106 to enter the voice-recognition state 407 described below for FIG. 4. Otherwise, if the signal amplitude of the analog audio input 122 exceeds the lower threshold but not the higher threshold, then the control block 111 activates the spectral analysis block 110 and awaits those results before determining whether to generate a VAD interrupt signal 116.

The combined digital-audio signal 125 from the sample combine block 108 is stored in the VAD RAM 112. This may occur essentially simultaneously with the combined digital-audio signal 125 also being received at the amplitude VAD block 109. The VAD RAM 112 may be, for example, a 1024-word, 20-bit RAM. In this example configuration, 512 words of the VAD RAM 112 may be used as an FFT working memory for in-place, 256-point FFT. Thus, 256 words of the VAD RAM 112 may be used for storage of input samples, and 256 words of the VAD RAM 112 may be used for storage of spectral amplitudes for 256 frequency bins. This is just one example configuration, however, and other configurations may be used.

The FFT block 113 performs a fast Fourier transform of the combined digital-audio signal 125 stored in the VAD RAM 112. As an example implementation, the FFT may be a 256-point FFT and consist of 8 radix-2 FFT stages. The FFT block 113 may write the resulting power for each frequency bin to the VAD RAM 112. Keeping with the example of 8 ksps samples and 256-point FFT, the FFT would be performed every 32 ms (milliseconds). In other words, the FFT window size is 32 ms in this example.

The spectral LPF 114 computes $$y' = y \cdot \frac{N-1}{N} + x \cdot \frac{1}{N},$$

where x is the magnitude of the last-stage FFT result; y is the stored spectral amplitude for the corresponding frequency bin; N is a smoothing factor, which can reduce the impact of random noise; and y' is the newly updated value for y. The spectral LPF 114 may also include an accumulator that sums the spectral amplitudes to compute the mean amplitude.

The spectral analysis block 110, when activated by the control block 111, decides if the control block 111 should generate a VAD interrupt signal 116 by using the results of the spectral LPF 114. The decision exploits the circumstance that voice signals, including voice commands that are part of the analog audio input 122, have multiple harmonics. Specifically, after the combined digital-audio signal 125 from the VAD RAM 112 passes through the FFT block 113 and the spectral LPF 114, the resulting spectral amplitude for each frequency is divided by the mean amplitude of all frequency bins resulting from the FFT. As used in this disclosure, the ratio of the spectral amplitude of a given frequency to the mean amplitude of all frequency bins is called the relative amplitude.

As one example method, the spectral VAD block 115 counts the number of frequency bins that have a relative amplitude above a certain threshold. Preferably, this high-amplitude threshold is between about 1.5 times and about five times the mean amplitude. More preferably, the high-amplitude threshold is between about two times and about four times the mean amplitude. Even more preferably, the high-amplitude threshold is about three times the mean amplitude. If the high-amplitude bin count exceeds a certain amount, referred to here as the bin-count threshold, then the spectral VAD block 115 decides that the control block 111 should generate a VAD interrupt signal 116. Preferably, this bin-count threshold is between about two and about fifteen bins. More preferably, the bin-count threshold is between about three and about twelve bins. Even more preferably, the bin-count threshold is between about five and about ten bins.

As another example method, to decide if the control block 111 should generate a VAD interrupt signal 116, the spectral VAD block 115 evaluates peak distance. In this context, a peak bin is a frequency bin with an amplitude that is higher than its neighbors and the frequency bin's relative amplitude is above a threshold. Preferably, this relative-amplitude threshold is between about 1.5 times and about five times the mean amplitude. More preferably, the relative-amplitude threshold is between about two times and about four times the mean amplitude. Even more preferably, the relative-amplitude threshold is about three times the mean amplitude. If the distance between the first peak bin (i.e. the peak bin that has the lowest frequency) and last peak bin (i.e. the peak bin that has the highest frequency) exceeds a certain value, then the spectral VAD block 115 decides that the control block 111 should generate a VAD interrupt signal 116. Preferably, this peak-distance threshold is between about 0.5 kHz and about 5 kHz. More preferably, the peak-distance threshold is between about 1 kHz and about 3 kHz. Even more preferably, the peak-distance threshold is about 2 kHz.

The spectral VAD block 115 might use either or both of the example methods described. Other similar methods might also be used. Preferably, the high-amplitude threshold, the bin-count threshold, the relative-amplitude threshold, and the peak-distance threshold are each individually user-programmable, such as, for example, through a user interface.

The spectral VAD block 115 may also determine the highest peak amplitude in the frequency bins and the position of the highest peak (i.e. which frequency bin has the highest peak). If the highest peak amplitude and its position do not change over a certain time interval, such as two seconds or longer, then the analog audio input 122 likely includes fixed-tone noise, such as the background noise within an airplane cabin. Thus, determining the highest peak amplitude and its position enable the spectral VAD to screen out fixed-tone noise. When screened out, fixed-tone noise is not included by the spectral VAD block 115 when it decides if the control block 111 should generate a VAD interrupt signal 116.

FIG. 3 is an example graph of audio signals from human speech, where the vertical axis represents signal amplitude and the horizontal axis represents time. As illustrated in FIG. 3, an incoming voice command 300, as received by the ADC 101, for example, may include a trigger phrase 301, or key phrase, and a command phrase 302 as well as a region between the trigger phrase 301 and the command phrase 302 called the endpoint 303 of the trigger phrase. The command phrase 302 may also have an endpoint 304 of the command phrase. The trigger phrase 301 may be, for example, a phrase uttered by a user that is intended to activate an intelligent personal assistant or otherwise alert a host that a command is about to be given by the user. Using current intelligent personal assistants as examples, the trigger phrase 301 may be, for instance, "OK Google," "Hey Siri," "Hello Jarvis," or "Hey Cortana." An example of a command phrase 302 is "what is today's weather?" Even so, the voice command 300 need not include both a trigger phrase 301 and a command phrase 302.

Returning to FIG. 1, the VAD interrupt signal 116 triggers the voice-recognition module 105 of the DSP 106 to run a voice-recognition algorithm. As an example, there may be three stages of voice-recognition by the DSP 106: VAD hysteresis with silence detection; voice-recognition key-phrase parsing 1× with silence detection; and software activity detection with key-phrase parsing>1×, host transmission, and silence detection.

In VAD hysteresis with silence detection, the voice-recognition module 105 builds a longer-term hysteresis of the hardware VAD decision by the VAD block 104. For example, the hysteresis may be built over a term that exceeds the FFT window size. As an example of one possible implementation, the FFT window size is 32 ms in the above example of 8 ksps samples and 256-point FFT. Hence, the hysteresis of the hardware VAD decision may be built over a term that is several times longer than the 32-ms window. For example, the hysteresis may be built for a term that is at least two times longer than the FFT window size. Preferably, the term is five to ten times the FFT window size. With silence detection, the voice-recognition module 105 determines whether the analyzed frame contains a voice signal. If it does not, the frame is deemed to be a silent frame.

In voice-recognition key-phrase parsing 1× with silence detection, the voice-recognition module 105 parses the analyzed frame for a trigger phrase 301, while the voice-recognition module 105 also performs silence detection as described above.

In software activity detection with key-phrase parsing>1×, host transmission, and silence detection, the voice-recognition module 105 parses the analyzed frame for a trigger phrase 301, while the voice-recognition module 105 also performs silence detection as described above. In addition, when a trigger phrase 301 is detected or recognized, the voice-recognition module 105 may transmit voice-command information to a host. The voice-command information may be, for example, the trigger phrase 301 or a signal corresponding to the trigger phrase 301, the command phrase 302 or a signal corresponding to the command phrase 302, or some other command to the host to act in response to the detected trigger phrase 301, or any combination of these.

The key-phrase parsing>1× is generally performed at a faster processing speed than the key-phrase parsing 1×. For example, the key-phrase parsing 1× may be performed by the DSP 106 operating at 12 MHz, while the key-phrase parsing>1× may be performed by the DSP 106 operating at a speed greater than 12 MHz, such as up to 98 MHz. This is described below with respect to the clock system 107. The faster processing speed may, for example, allow the parsing process to catch up in time to the pointer of the circular buffer of the voice RAM 103.

FIG. 4 is a flowchart showing an example process 400 of a voice-recognition module, such as the voice-recognition module 105 of the DSP 106 illustrated in FIG. 1. The voice-recognition module starts in the software VAD state 401. Next, the voice-recognition module determines 402 whether the analyzed frame is a silence frame, meaning that the frame contains no voice signal. If the frame is a not a silence frame, then the process passes to the voice recognition state, which is further described below. If the frame is a silence frame, then the process determines 403 whether there is a silence timeout. A silence timeout may occur, for example, if the circular buffer is filled with silence frames or if a silence hysteresis threshold is met. Preferably, the silence hysteresis threshold is user programmable. If there is no silence timeout, the process returns to the software VAD state 401. If there is a silence timeout, then the process proceeds to a suspend state 404, where the DSP remains idle until it receives a VAD interrupt signal 116 from the VAD block 104. When the voice-recognition module receives 405 a VAD interrupt signal 116 from the VAD block 104, the DSP leaves the idle state and enters a more active mode 406, such as a 12 MHz mode. The process then moves to the full, voice-recognition state 407.

In the voice-recognition state 407, the voice-recognition module 105 of the DSP 106 parses 408 the analyzed frame for a trigger phrase 301. Thus, the block 408 represents the software VAD decision. If a trigger phrase is recognized, the process opens 409 a voice-connection link to the host to transmit voice-command information to the host for further processing or to act in response to the trigger phrase 301. As noted above, the voice-command information may be a command phrase 302 sent to the host. If a trigger phrase is not recognized, the process returns to the software VAD state 401 and continues as discussed above. That is, the voice-recognition module determines 402 whether the analyzed frame is a silence frame as noted above. If the process determines 403 that a silence timeout occurred, then the voice recognition, begun during the voice-recognition state 407, will stop running as the process proceeds to a suspend state 404 to await a VAD interrupt signal 116 from the VAD block 104 as described above.

Hence, the software VAD state 401 builds a longer-term hysteresis of the hardware VAD decision by the VAD block 104. The described implementation may be a majority vote decision system, and can work with just the hardware VAD decision, as described above for the VAD block 104 of FIG. 1, or the implementation can incorporate other frame-based detections in the software.

When the system is listening, the voice samples are being stored into a circular buffer, or FIFO, such as the voice RAM 103 discussed above for FIG. 1. The FIFO, or history buffer, is read on a per frame basis in the software. Depending on the mode, the depth of the FIFO can vary. The software is structured to consume as much data as possible, and will occasionally throttle the DSP 106 dynamically based on the state. For example, while awaiting the software VAD event, the DSP speed can be quite low because the algorithms in use do not require a large number of cycles. But when enough voice activity is detected to justify running the full voice-recognition state 407, the DSP speed may be increased.

The frame-based decision making in the software may introduce a small amount of latency relative to the real-time samples coming from the ADC 101. The software has to read into the FIFO and retroactively run the voice recognition algorithm from the point where the voice command 300 was first detected. The DSP speed may also be increased to "catch up" to real time, and the DSP speed be decreased once the number of outstanding frames is below a defined threshold. For example, the DSP may be considered to be "caught up" to real time when the number of outstanding frames is back to one.

When the voice recognition state 407 and the parsing state 408 recognize a trigger phrase, the system may run an endpoint algorithm to detect the endpoint of the trigger phrase, such as the endpoint 303 shown in FIG. 3, and then discard all data before, or up to and including, the end of the trigger phrase. This allows the system to flush a certain amount of the FIFO and then repurpose the FIFO memory for one-shot detection, which is described below. The system continues to use the software VAD decision to determine if the user is continuing to speak after the first voice recognition, while buffering the samples in the FIFO.

In a feature called one-shot detection, continuous speech parsing is used to determine whether the user continued to speak after uttering the trigger phrase 301. Thus, for one-shot detection the system buffers data to account for latency in opening a voice connection to the host after a trigger phrase 301 is detected. The software VAD decision allows the system to determine if the user spoke within the one-shot timeout—a specified period of time after detection of the trigger phrase—and can also be used to discard a certain amount of leading silence after the trigger phrase 301 is detected. In this way, latency may be absorbed. Also, once the endpoint of the one-shot phrase is detected, any extraneous samples in the voice RAM 103 will be discarded or assumed to be silence. In this context, the one-shot phrase means the detected trigger phrase 301, plus any additional speech within the one-shot timeout such as, for example a command phrase 302. Accordingly, any subsequent voice packets for an interaction with the host, such as an intelligent personal assistant, are substantially caught up to real time, making the interaction more conversational.

As noted above, the clock system 107 includes a plurality of clock generating mechanisms. The clock generating mechanisms preferably consume different amounts of current to generate a clock and are asynchronous. By way of example, a first clock generating mechanism, or sleep-mode clock mechanism, may utilize a phase-locked loop (PLL) circuit, without a crystal oscillator running, to generate a clock at, for example, 12.288 MHz. As another example, a second clock generating mechanism, or low-power clock mechanism, may utilize the PLL circuit, with the crystal oscillator running, to generate a clock at, for example, 12.288 MHz. A third clock generating mechanism, or high-power clock mechanism, may utilize the second clock generating mechanism to derive a clock at, for example, up to 98 MHz. As described here, the first clock generating mechanism has lower current consumption than the second clock generating mechanism, and the second clock generating mechanism has lower current consumption than the third clock generating mechanism. Likewise, the third clock generating mechanism is faster than the second clock generating mechanism, and the second clock generating mechanism is more robust than the first clock generating mechanism.

The clock system 107 is configured to switch between the available clock generating mechanisms. Thus, to lower current consumption, the first clock generating mechanism can be used in place of the second clock generating mechanism or the third clock generating mechanism. Likewise, the second clock generating mechanism can be used in place of the third clock generating mechanism to lower current consumption. Accordingly, the first clock generating mechanism may be used, for example, when the VAD block 104 is active, but the DSP 106 is not running a voice-recognition algorithm. The second clock generating mechanism may be used, for example, when the DSP 106 is running a voice-recognition algorithm after having received a VAD interrupt signal 116 from the VAD block, 104. And the third clock generating mechanism may be used, for example, when higher processing speeds are needed or desired. This may exist, for example, when the process opens a voice-connection link to the host, to run in the >1× key-phrase parsing mode, or when the voice-recognition algorithm needs more cycles to run in the 1× key-phrase parsing mode. Other configurations may also be used. Because digital audio logic typically runs at 12 MHz, it could use any of these example clocks.

When the clock system 107 switches between clock generating mechanisms, preferably it switches simultaneously for the entire voice-command detection and capture system 100, including the DSP 106, the voice RAM 103, the VAD block 104, the decimation filter 102, and the ADC 101. Since the ADC 101 data rates are fractions of the 12.288 MHz source, the 12.288 MHz source switches at a particular phase of the fractional clocks.

An example of a clock switching event is shown in FIG. 5, where the example switching event is marked by the arrow 517. As illustrated in FIG. 5, when switching between the current asynchronous clock source and a new asynchronous clock source, the clock system, such as the clock system 107, may effectively halt the current clock source at a particular phase and wait for the edges of the new clock source. This allows the clock system to switch between clock sources at a particular phase of the clock generating mechanism. Accordingly, the clock system provides clock edge alignment between different clock rates.

Switching between asynchronous clock sources allows relatively lower-power clocks to be used for some features or in some circumstances of the system and higher-quality clocks to be used for other features or in other circumstances. Moreover, switching clock sources simultaneously for all aspects of the system allows continuous sample capture with discontinuities introduced only by the missed sample time at the moment of the clock switch.

As noted above, the low-power, always-listening, voice-command detection and capture system 100 includes a number of discrete operational states. Referring again to FIG. 1, as one example implementation, six example operational states may be as described below, in order of increasing current consumption.

EXAMPLE OPERATIONAL STATES

Example Operational State 1: Sleep Mode Waiting for Hardware Amplitude Trigger

In this state, the ADC 101 compares levels but does not generate samples for the VAD block 104 or the voice RAM 103. When the level of audio activity exceeds a specified minimum level, the wakeup circuit 118 triggers the remainder of the ADC 101 to generate samples. As described above, the converter portion of the ADC 101 may not be drawing any power while the ADC 101 is in this level-comparison mode. Accordingly, the VAD block 104 and the voice RAM 103 are inactive. The clock is in sleep mode, and the DSP 106 is idle.

Example Operational State 2: Always-Listening State Waiting for Hardware Amplitude Voice Trigger In this state, the ADC 101 generates samples for the VAD block 104 and the voice RAM 103 from the analog audio input 122. The voice RAM 103 writes the samples to its circular buffer. The clock is in low-power mode, and the DSP 106 is idle. The VAD block 104 is in amplitude detect mode, meaning that the amplitude VAD block 109 is active. Thus, returning to the example described above for the operation of the control block 111, the signal amplitude of the analog audio input 122 to the ADC 101 does not exceed the lower threshold of the control block 111. Accordingly, the control block 111 will neither trigger the spectral analysis block 110 nor generate a VAD interrupt signal 116.

Example Operational State 3: Always-Listening State Waiting for Hardware Spectral Voice Trigger In this state, the ADC 101 generates samples for the VAD block 104 and the voice RAM 103 from the analog audio input 122. The voice RAM 103 writes the samples to its circular buffer. The clock is in low-power mode, and the DSP 106 is idle. The VAD block 104 is in spectral detect mode, meaning that the spectral analysis block 110 is active. Thus, returning to the example described above for the operation of the control block 111, the signal amplitude of the analog audio input 122 to the ADC 101 exceeds the lower threshold but not the higher threshold of the control block 111. Accordingly, the control block 111 activates the spectral analysis block 110 and awaits those results.

Example Operational State 4: Low-Current Voice Detection

In this state, the ADC 101 generates samples for the VAD block 104 and the voice RAM 103 from the analog audio input 122. The voice RAM 103 writes the samples to its circular buffer, and the clock is in low-power mode. The VAD block 104 is in the spectral detect mode or the amplitude detect mode. Thus, returning to the example described above for the operation of the control block 111, the signal amplitude of the analog audio input 122 to the ADC 101 exceeds the lower threshold and the higher threshold of the control block 111. Accordingly, the control block 111 generates a VAD interrupt signal 116 regardless of the spectral VAD decision from the spectral analysis block 110. The DSP 106 is in VAD hysteresis mode with silence detection, meaning, for example, that the DSP 106 proceeds through the process denoted by elements 401-405 shown in FIG. 4.

Example Operational State 5: Low-Current Voice Recognition

In this state, the ADC 101 generates samples for the VAD block 104 and the voice RAM 103 from the analog audio input 122. The voice RAM 103 writes the samples to its circular buffer, and the buffer is read by the DSP 106. The clock is in low-power mode. The VAD block 104 is in the spectral detect mode or the amplitude detect mode, as described above, the VAD block 104 having generated a VAD interrupt signal 116. The DSP 106 is in the voice recognition state 407, in which the voice-recognition algorithm of the DSP 106 parses the analyzed frame for a trigger phrase 301. Thus, for example, the DSP 106 proceeds through the process denoted by elements 401-408 shown in FIG. 4, including silence detection, with a "no" decision resulting at element 408.

Example Operational State 6: Low-Current Voice-Command Processing

In this state, the ADC 101 generates samples for the VAD block 104 and the voice RAM 103 from the analog audio input 122. The voice RAM 103 writes the samples to its circular buffer, and the buffer is read by the DSP 106. The clock is in high-power mode. The VAD block 104 is in the spectral detect mode or the amplitude detect mode, as described above. The voice-recognition algorithm of the DSP 106 parses the analyzed frame for a trigger phrase 301, with a "yes" decision resulting at element 408 of FIG. 4. Thus, for example, the DSP 106 proceeds through the process denoted by elements 401-409 shown in FIG. 4, including silence detection.

In embodiments, these operational states may be independently enabled or disabled. Hence, the system may, in such embodiments, choose to use all or just some of the available operational states. For example, to reduce false amplitude triggers in a noisy environment, the system may choose a relatively higher state, such as operational state 3, 4, 5, or 6 described above, and avoid a relatively lower operational state, such as operational state 1 or 2 described above. Also, to avoid sleeping and ensure that the beginning of a trigger phrase 301 is captured and not truncated, the system may avoid a relatively lower operational state, such as operational state 1 described above. On the other hand, to reduce current consumption, the system may choose a relatively lower state, such as operational state 1, 2, 3, 4, or 5 described above over a relatively higher operational state.

ILLUSTRATIVE EXAMPLES

Illustrative examples of the disclosed technologies are provided below. An embodiment of the technologies may include one or more, and any combination of, the examples described below.

Example 1 includes a system for detecting and capturing voice commands, the system comprising a voice-activity detector (VAD) configured to: receive a VAD-received digital-audio signal; determine the amplitude of the VAD-received digital-audio signal; compare the amplitude of the VAD-received digital-audio signal to a first threshold and to a second threshold; withhold a VAD interrupt signal when the amplitude of the VAD-received digital-audio signal does not exceed the first threshold or the second threshold; generate the VAD interrupt signal when the amplitude of the VAD-received digital-audio signal exceeds the first threshold and the second threshold; and perform spectral analysis of the VAD-received digital-audio signal when the amplitude of the VAD-received digital-audio signal is between the first threshold and the second threshold.

Example 2 includes the system of Example 1, further comprising an analog-to-digital converter (ADC) configured to receive an analog audio input, the ADC having a converter portion configured to generate, from the analog audio input, a digital-audio signal at a ADC sampling rate.

Example 3 includes the system of Example 2, in which the ADC includes a wakeup circuit configured to: determine whether the analog audio input has an onset level of audio activity; and when the analog audio input does not have the onset level of audio activity, place the ADC in a sleep mode in which the converter portion of the ADC does not generate a digital-audio signal; and when the analog audio input has the onset level of audio activity, place the ADC in an active mode in which the converter portion of the ADC generates a digital-audio signal.

Example 4 includes the system of Example 3, in which, to determine whether the analog audio input has an onset level of audio activity, the wakeup circuit is configured to compare the analog audio input to a wakeup-onset threshold.

Example 5 includes the system of any of Examples 3-4, in which the wakeup circuit comprises: an audio preamp a gain stage configured to boost the analog audio input; and a comparator stage configured to compare the boosted analog audio input to a wakeup-onset threshold indicating the onset level of audio activity.

Example 6 includes the system of any of Examples 3-5, in which the converter portion of the ADC is unpowered when the ADC in the sleep mode, and in which the converter portion of the ADC is powered when the ADC in the active mode.

Example 7 includes the system of any of Examples 2-6, further comprising a decimation filter between the ADC and the VAD, the decimation filter configured to receive the digital-audio signal and process the digital-audio signal to generate reduced digital-audio samples having a reduced sampling rate, the reduced sampling rate being lower than the ADC sampling rate.

Example 8 includes the system of any of Examples 1-7, in which the VAD comprises: a sample combine block configured to receive as an input the VAD-received digital-audio signal having a sampling rate and to process the VAD-received digital-audio signal to generate a combined digital-audio signal having an amplitude, the combined digital-audio signal having a sampling rate lower than the sampling rate of the VAD-received digital-audio signal; an amplitude VAD block configured to determine the amplitude of the combined digital-audio signal; a spectral analysis block configured to perform spectral analysis of the VAD-received digital-audio signal; and a control block comprising two comparators, the control block being configured to: compare the amplitude of the VAD-received digital-audio signal to a first threshold and to a second threshold, withhold a VAD interrupt signal and activate the spectral analysis block when the amplitude of the VAD-received digital-audio signal does not exceed the first threshold or the second threshold, and generate the VAD interrupt signal when the amplitude of the VAD-received digital-audio signal exceeds the first threshold and the second threshold.

Example 9 includes the system of Example 8, in which the spectral analysis block comprises: a VAD random-access memory (RAM) configured to receive from the sample combine block and store the combined digital-audio signal; a fast Fourier transform (FFT) block configured to perform an FFT of the combined digital-audio signal stored in the VAD RAM and output FFT results; a spectral low-pass filter (LPF) configured to determine a mean amplitude of the FFT results; and a spectral VAD block configured to evaluate the results of the spectral LPF and, based on the evaluation of the results of the spectral LPF, signal the control block to generate a VAD interrupt signal or to continue to withhold a VAD interrupt signal.

Example 10 includes the system of any of Examples 1-9, further comprising a digital signal processor (DSP) configured to receive the VAD interrupt signal from the VAD and analyze the VAD-received digital-audio signal for a trigger phrase.

Example 11 includes the system of Example 10, further comprising a voice random-access memory (RAM) configured to receive and store the VAD-received digital-audio signal in a first-in, first-out (FIFO) format, the voice RAM being configured to be accessed by the DSP.

Example 12 includes the system of any of Examples 10-11, further comprising a clock system comprising a plurality of asynchronous clock generating mechanisms, each of the asynchronous clock generating mechanisms having a different current consumption, the clock system being configured to switch between the asynchronous clock generating mechanisms.

Example 13 includes a method of detecting and capturing voice commands comprising: receiving, by a voice-activity detector (VAD), a VAD-received digital-audio signal; determining, by the VAD, the amplitude of the VAD-received digital-audio signal; comparing, by the VAD, the amplitude of the VAD-received digital-audio signal to a first threshold and to a second threshold; withholding, by the VAD, a VAD interrupt signal when the amplitude of the VAD-received digital-audio signal does not exceed the first threshold or the second threshold; generating, by the VAD, the VAD interrupt signal when the amplitude of the VAD-received digital-audio signal exceeds the first threshold and the second threshold; and performing, by the VAD, spectral analysis of the VAD-received digital-audio signal when the amplitude of the VAD-received digital-audio signal is between the first threshold and the second threshold.

Example 14 includes the method of Example 13, further comprising: receiving, by an analog-to-digital converter (ADC), an analog audio input; determining, by a wakeup circuit, whether the analog audio input has an onset level of audio activity; and when the analog audio input does not have the onset level of audio activity, placing the ADC in a sleep mode in which the converter portion of the ADC does not generate a digital-audio signal; and when the analog audio input has the onset level of audio activity, placing the ADC in an active mode in which a converter portion of the ADC generates a digital-audio signal from the analog audio input at an ADC sampling rate.

Example 15 includes the method of Example 14, in which determining, by a wakeup circuit, whether the analog audio input has an onset level of audio activity comprises comparing the analog audio input to a wakeup-onset threshold.

Example 16 includes the method of any of Examples 14-15, further comprising: unpowering the converter portion of the ADC when the ADC in the sleep mode; and powering the converter portion of the ADC when the ADC in the active mode.

Example 17 includes the method of any of Examples 14-16, further comprising: receiving, by a digital signal processor (DSP), the VAD interrupt signal from the VAD; and analyzing, by the DSP, the VAD-received digital-audio signal to detect a trigger phrase.

Example 18 includes the method of any of Examples 13-17, further comprising receiving and storing, by a voice random-access memory (RAM), the VAD-received digital-audio signal in a first-in, first-out (FIFO) format.

Example 19 includes the method of Example 18, further comprising, when a trigger phrase is detected by the DSP, discarding all data on the voice RAM before an endpoint of the trigger phrase.

Example 20 includes the method of any of Examples 17-19, further comprising, when a trigger phrase is detected by the DSP, determining whether a user spoke during a prespecified timeout period after the trigger phrase.

The previously described versions of the disclosed subject matter have many advantages that were either described or would be apparent to a person of ordinary skill. Even so, all of these advantages or features are not required in all versions of the disclosed apparatus, systems, or methods. Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Moreover, embodiments of the invention may operate on a particularly created hardware, on firmware, digital signal processors, or on a specially programmed general purpose computer including a processor operating according to programmed instructions. The term "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components. Also, when reference is made in this application to a method having two or more defined steps or operations, the defined steps or operations can be carried out in any order or simultaneously, unless the context excludes those possibilities.

Additionally, although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A system for detecting and capturing voice commands, the system comprising:
    an input configured to receive an audio signal;
    an analog to digital converter configured to convert the audio signal to a digital-audio signal;
    an amplitude detector configured determine the amplitude of the digital-audio signal;
    a controller configured to compare the amplitude of the digital-audio signal to a first threshold and to a second threshold and withhold an interrupt signal when the amplitude of the digital-audio signal does not exceed the first threshold or the second threshold, generate the interrupt signal when the amplitude of the digital-audio signal exceeds the first threshold and the second threshold, and trigger spectral analysis of the digital-audio signal when the amplitude of the digital-audio signal is between the first threshold and the second threshold.

2. The system of claim 1 in which the analog to digital converter includes a wakeup circuit configured to:
    determine whether the audio signal has an onset level of audio activity;
    when the audio signal does not have the onset level of audio activity, place the analog to digital converter in a sleep mode in which a converter portion of the analog to digital converter does not generate the digital-audio signal; and
    when the audio signal has the onset level of audio activity, place the analog to digital converter in an active mode in which the converter portion of the analog to digital converter generates the digital-audio signal.

3. The system of claim 2 in which, to determine whether the an audio signal has an onset level of audio activity, the wakeup circuit is configured to compare the audio signal to a wakeup-onset threshold.

4. The system of claim 2 in which the wakeup circuit comprises:
    an audio preamp a gain stage configured to boost the audio signal; and
    a comparator stage configured to compare the boosted audio signal to a wakeup-onset threshold indicating the onset level of audio activity.

5. The system of claim 2 in which the converter portion of the analog to digital converter is unpowered when the analog to digital converter is in the sleep mode, and in which the converter portion of the analog to digital converter is powered when the analog to digital converter in the active mode.

6. The system of claim 2 further comprising a decimation filter between the analog to digital converter and the amplitude detector, the decimation filter configured to receive the digital-audio signal and process the digital-audio signal to generate reduced digital-audio samples having a reduced sampling rate, the reduced sampling rate being lower than the analog to digital converter sampling rate.

7. The system of claim 1 further comprising:
    a sample combine block configured to receive as an input the digital-audio signal having a sampling rate and to process the digital-audio signal to generate a combined digital-audio signal having an amplitude, the combined digital-audio signal having a sampling rate lower than the sampling rate of the digital-audio signal.

8. The system of claim 1 further comprising a digital signal processor configured to receive the interrupt signal and analyze the digital-audio signal for a trigger phrase.

9. The system of claim 8 further comprising a voice random-access memory configured to receive and store the digital-audio signal in a first-in, first-out format, the voice random-access memory being configured to be accessed by the digital signal processor.

10. The system of claim 8 further comprising a clock system comprising a plurality of asynchronous clock generating mechanisms, each of the asynchronous clock generating mechanisms having a different current consumption, the clock system being configured to switch between the asynchronous clock generating mechanisms.

11. A method of detecting and capturing voice commands comprising:
receiving, by a voice-activity detector, a digital-audio signal;
determining, by the voice-activity detector, the amplitude of the digital-audio signal;
comparing, by the voice-activity detector, the amplitude of the digital-audio signal to a first threshold and to a second threshold;
withholding, by the voice-activity detector, an interrupt signal when the amplitude of the digital-audio signal does not exceed the first threshold or the second threshold;
generating, by the voice-activity detector, the interrupt signal when the amplitude of the digital-audio signal exceeds the first threshold and the second threshold; and
performing, by the voice-activity detector, spectral analysis of the digital-audio signal when the amplitude of the digital-audio signal is between the first threshold and the second threshold.

12. The method of claim 11 further comprising:
receiving, by an analog-to-digital converter, an audio signal;
determining, by a wakeup circuit, whether the audio signal has an onset level of audio activity; and
when the audio signal does not have the onset level of audio activity, placing the analog to digital converter in a sleep mode in which the converter portion of the analog to digital converter does not generate a digital-audio signal; and
when the audio signal has the onset level of audio activity, placing the analog to digital converter in an active mode in which a converter portion of the analog to digital converter generates a digital-audio signal from the audio signal at an analog to digital converter sampling rate.

13. The method of claim 12 in which determining, by a wakeup circuit, whether the audio signal has an onset level of audio activity comprises comparing the audio signal to a wakeup-onset threshold.

14. The method of claim 12 further comprising:
unpowering the converter portion of the analog to digital converter when the analog to digital converter in the sleep mode; and
powering the converter portion of the analog to digital converter when the analog to digital converter in the active mode.

15. The method of claim 12 further comprising:
receiving, by a digital signal processor, the interrupt signal from the voice-activity detector; and
analyzing, by the digital signal processor, the digital-audio signal to detect a trigger phrase.

16. The method of claim 15 further comprising receiving and storing, by a voice random-access memory, the digital-audio signal in a first-in, first-out format; and, when a trigger phrase is detected by the digital signal processor, discarding all data on the voice RAM before an endpoint of the trigger phrase.

17. The method of claim 15 further comprising, when a trigger phrase is detected by the digital signal processor, determining whether a user spoke during a prespecified timeout period after the trigger phrase.

18. A voice-activity detector, comprising:
an input configured to receive a digital-audio signal;
an amplitude detector configured determine the amplitude of the digital-audio signal; and
a controller configured to withhold an interrupt signal when the amplitude of the digital-audio signal does not exceed a first threshold or a second threshold, generate the interrupt signal when the amplitude of the digital-audio signal exceeds the first threshold and the second threshold, and trigger spectral analysis of the digital-audio signal when the amplitude of the digital-audio signal is between the first threshold and the second threshold; and
a spectral analyzer configured to perform the spectral analysis of the digital-audio signal to instruct the controller whether to generate the interrupt signal.

19. The voice-activity detector of claim 18 further comprising a sample combiner configured to receive as an input the digital-audio signal having a sampling rate and to process the digital-audio signal to generate a combined digital-audio signal having an amplitude, the combined digital-audio signal having a sampling rate lower than the sampling rate of the digital-audio signal.

20. The voice-activity detector of claim 18 in which the spectral analyzer includes
a VAD random-access memory (RAM) configured to receive from the sample combine block and store the combined digital-audio signal;
a fast Fourier transform block configured to perform a fast Fourier transform of the combined digital-audio signal stored in the VAD RAM and output fast Fourier transform results;
a spectral low-pass filter configured to determine a mean amplitude of the fast Fourier transform results; and
a spectral controller configured to evaluate the results of the spectral low pass filter and, based on the evaluation of the results of the spectral low past filter, signal the control block to generate the interrupt signal or to continue to withhold the interrupt signal.

* * * * *